US010269837B2

(12) United States Patent
Lin

(10) Patent No.: US 10,269,837 B2
(45) Date of Patent: Apr. 23, 2019

(54) SENSOR, MANUFACTURING METHOD THEREOF AND ELECTRONIC DEVICE

(71) Applicants: BOE TECHNOLOGY GROUP CO., LTD., Beijing (CN); KA IMAGING INC., Ontario (CA)

(72) Inventor: Chia Chiang Lin, Beijing (CN)

(73) Assignees: BOE TECHNOLOGY GROUP CO., LTD., Beijing (CN); KA IMAGING INC., Kitchener, ON (CA)

( * ) Notice: Subject to any disclaimer, the term of this patent is extended or adjusted under 35 U.S.C. 154(b) by 0 days.

(21) Appl. No.: 15/540,411

(22) PCT Filed: Sep. 21, 2016

(86) PCT No.: PCT/CN2016/099579
§ 371 (c)(1),
(2) Date: Jun. 28, 2017

(87) PCT Pub. No.: WO2017/177618
PCT Pub. Date: Oct. 19, 2017

(65) Prior Publication Data
US 2018/0122841 A1 May 3, 2018

(30) Foreign Application Priority Data
Apr. 15, 2016 (CN) .......................... 2016 1 0236910

(51) Int. Cl.
*G01L 9/08* (2006.01)
*H01L 31/02* (2006.01)
(Continued)

(52) U.S. Cl.
CPC ........ *H01L 27/1446* (2013.01); *H01L 29/786* (2013.01); *H01L 31/02005* (2013.01);
(Continued)

(58) Field of Classification Search
CPC ............ H01L 27/1446; H01L 31/02005; H01L 31/02164; H01L 31/03762; H01L 31/202
See application file for complete search history.

(56) References Cited

U.S. PATENT DOCUMENTS 6,236,063 B1 * 5/2001 Yamazaki ........... G02F 1/13318
257/59
6,600,172 B1 7/2003 Matsuno
(Continued)

FOREIGN PATENT DOCUMENTS

CN 202796954 U 3/2013
CN 203085544 U 7/2013
(Continued)

OTHER PUBLICATIONS

The International Search Report and Written Opinion dated Jan. 18, 2017; PCT/CN2016/099579.
(Continued)

Primary Examiner — Mark W Tornow
(74) Attorney, Agent, or Firm — Ladas & Parry LLP

(57) ABSTRACT

A sensor, a manufacturing method thereof and an electronic device. The sensor includes: a base substrate; a thin-film transistor (TFT) disposed on the base substrate and including a source electrode; a first insulation layer disposed on the TFT and provided with a first through hole running through the first insulation layer; a conductive layer disposed in the first through hole and on part of the first insulation layer and electrically connected with the source electrode via the first through hole; a bias electrode disposed on the first insulation layer and separate from the conductive layer; a sensing active layer respectively connected with the conductive layer and the bias electrode; and an auxiliary conductive layer disposed on the conductive layer. The sensor and the manufacturing method thereof improve the conductivity and ensure normal transmission of signals by arranging the auxiliary conductive layer on the conductive layer without addition of processes.

16 Claims, 7 Drawing Sheets

(51) Int. Cl.
  *H01L 31/20* (2006.01)
  *H01L 27/144* (2006.01)
  *H01L 29/786* (2006.01)
  *H01L 31/0216* (2014.01)
  *H01L 31/0376* (2006.01)

(52) U.S. Cl.
  CPC .. *H01L 31/02164* (2013.01); *H01L 31/03762* (2013.01); *H01L 31/202* (2013.01); *G01L 9/08* (2013.01); *Y02P 70/521* (2015.11)

(56) References Cited

U.S. PATENT DOCUMENTS

2008/0067324 A1* 3/2008 Heiler ............... H01L 27/14658 250/208.1
2009/0250699 A1* 10/2009 Okada ............... H01L 27/14663 257/53
2015/0287760 A1* 10/2015 Karim ............... H01L 27/14663 257/53
2018/0114802 A1 4/2018 Lin

FOREIGN PATENT DOCUMENTS

| | | |
|---|---|---|
| CN | 103296037 A | 9/2013 |
| CN | 105720063 A | 6/2016 |
| CN | 205508828 A | 8/2016 |
| JP | 2007-005774 A | 1/2007 |

OTHER PUBLICATIONS

The Second Chinese Office Action dated Nov. 26, 2018; Appln. No. 20161023910.9.

Korean Office Action dated Feb. 21, 2019; Appln. No. 10-2017-7019102.

* cited by examiner

SENSOR, MANUFACTURING METHOD THEREOF AND ELECTRONIC DEVICE

The application claims priority to the Chinese patent application No. 201610236910.9, filed Apr. 15, 2016, the entire disclosure of which is incorporated herein by reference as part of the present application.

TECHNICAL FIELD

Embodiments of the present disclosure relate to a sensor, a manufacturing method thereof and an electronic device.

BACKGROUND

Photoelectric sensors have the advantages of high accuracy, fast response, non-contact, simple structure and the like, and are widely applied in detection and control. For instance, the photoelectric sensors may be applied in the aspects of smoke dust monitors, bar code scanning guns, product counters, photoelectric smoke alarms, etc.

The photoelectric sensors comprise thin-film transistors (TFTs) and photodiodes. The photodiodes receive light and convert optical signals into electrical signals. The TFTs control the reading of the electrical signals.

SUMMARY

Embodiments of the present disclosure provide a sensor and a manufacturing method thereof, which improve the conductivity and ensure the normal transmission of signals by arranging an auxiliary conductive layer on a thin conductive layer without addition of processes.

An embodiment of the present disclosure provides a sensor, comprising: a base substrate; a thin-film transistor (TFT) disposed on the base substrate and including a source electrode; a first insulation layer disposed on the TFT and provided with a first through hole running through the first insulation layer; a conductive layer disposed in the first through hole and on part of the first insulation layer and electrically connected with the source electrode via the first through hole; a bias electrode disposed on the first insulation layer and separate from the conductive layer; a sensing active layer respectively connected with the conductive layer and the bias electrode; and an auxiliary conductive layer disposed on the conductive layer.

For example, in the sensor according to an embodiment of the disclosure, the auxiliary conductive layer is separate from the sensing active layer.

For example, in the sensor according to an embodiment of the disclosure, the auxiliary conductive layer is a metal oxide conductive layer.

For example, in the sensor according to an embodiment of the disclosure, the auxiliary conductive layer is an indium tin oxide (ITO) layer or an indium zinc oxide (IZO) layer.

For example, in the sensor according to an embodiment of the disclosure, the auxiliary conductive layer is in direct contact with the conductive layer.

For example, in the sensor according to an embodiment of the disclosure, a second insulation layer is disposed on the sensing active layer.

For example, in the sensor according to an embodiment of the disclosure, the conductive layer is a metal conductive layer.

For example, in the sensor according to an embodiment of the disclosure, a thickness of the conductive layer is from 10 nm to 100 nm.

For example, the sensor according to an embodiment of the disclosure further comprises a passivation layer provided with a second through hole; in a direction perpendicular to the base substrate, the passivation layer is disposed between the source electrode and the first insulation layer; the second through hole is configured to run through the passivation layer and communicate with the first through hole; and the conductive layer is electrically connected with the source electrode via the first through hole and the second through hole.

For example, in the sensor according to an embodiment of the disclosure, a maximum aperture of the second through hole is less than a minimum aperture of the first through hole.

For example, the sensor according to an embodiment of the disclosure further comprises a metal shield provided with a third through hole; the metal shield is disposed between the passivation layer and the first insulation layer; the third through hole is configured to run through the metal shield and communicate with the first through hole and the second through hole; and the conductive layer is electrically connected with the source electrode via the first through hole, the second through hole and the third through hole.

For example, in the sensor according to an embodiment of the disclosure, a projection of the metal shield on the base substrate is at least partially overlapped with a projection of an active layer of the TFT on the base substrate.

For example, in the sensor according to an embodiment of the disclosure, a maximum aperture of the third through hole is less than a minimum aperture of the first through hole, and a minimum aperture of the third through hole is greater than a maximum aperture of the second through hole.

For example, in the sensor according to an embodiment of the disclosure, the conductive layer is at least disposed on side walls of the first through hole, the second through hole and the third through hole; and part of the conductive layer, at least disposed on the side walls, is completely covered by the auxiliary conductive layer.

For example, in the sensor according to an embodiment of the disclosure, a thickness of the first insulation layer is from 1 μm to 4 μm.

An embodiment of the present disclosure further provides an electronic device comprising the sensor according to any one of embodiments.

An embodiment of the present disclosure further provides a method for manufacturing a sensor, comprising: forming a thin film transistor (TFT) on a base substrate, in which the TFT includes a source electrode; forming a first insulation layer on the TFT, in which the first insulation layer is provided with a first through hole; forming a conductive layer in the first through hole and on part of the first insulation layer, in which the conductive layer is electrically connected with the source electrode via the first through hole; forming a bias electrode separate from the conductive layer and a sensing active layer on the first insulation layer, in which the sensing active layer is respectively connected with the conductive layer and the bias electrode; and forming an auxiliary conductive layer on the conductive layer.

For example, the method for manufacturing the sensor according to an embodiment of the present disclosure further comprises: forming a second insulation layer on the sensing active layer.

For example, the method for manufacturing the sensor according to an embodiment of the present disclosure further comprises: forming a passivation layer between the source electrode and the first insulation layer, in which the passivation layer is provided with a second through hole communicating with the first through hole; and forming a conductive layer electrically connected with the source electrode via the first through hole and the second through hole.

For example, the method for manufacturing the sensor according to an embodiment of the present disclosure further comprises: forming a metal shield between the passivation layer and the first insulation layer, in which the metal shield is provided with a third through hole communicating with the first through hole and the second through hole; and forming a conductive layer electrically connected with the source electrode via the first through hole, the second through hole and the third through hole.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS OF THE ACCOMPANYING DRAWINGS

Figure 1:
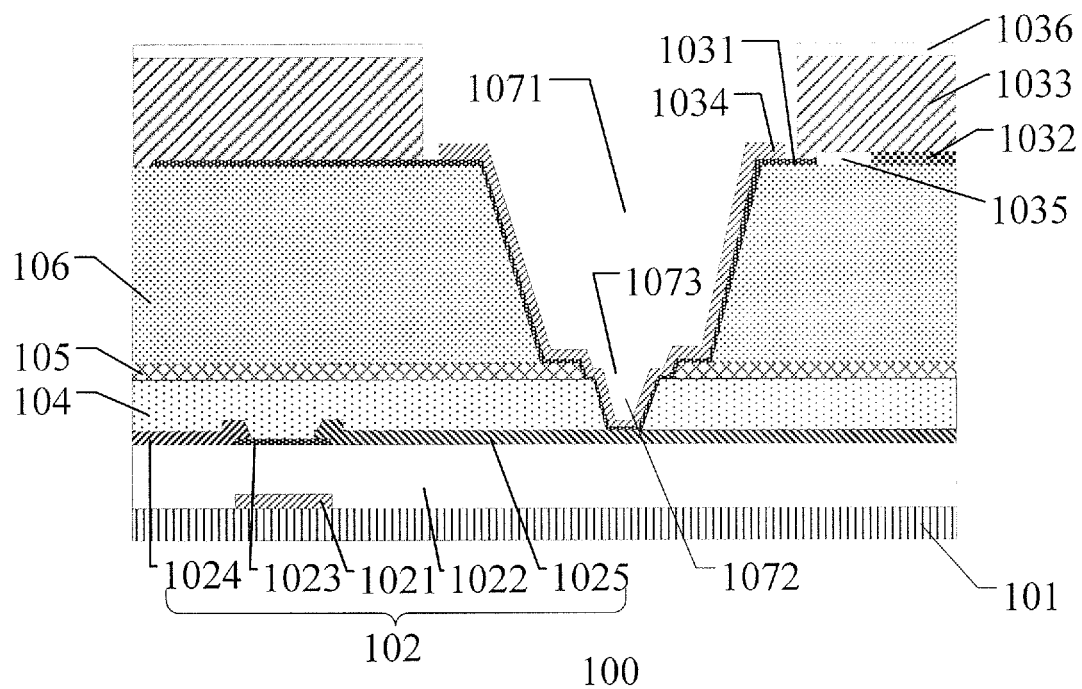
FIG. 1 is a sectional view of a sensor provided by an embodiment of the present disclosure.

100—sensor; 101—base substrate; 102—TFT; 1021—gate electrode; 1022—gate insulation layer; 1023—active layer; 1024—drain electrode; 1025—source electrode; 1031—conductive layer; 1032—bias electrode; 1033—sensing active layer; 1034—auxiliary conductive layer; 1035—insulation spacer layer; 1036—second insulation layer; 104—passivation layer; 105—metal shield; 106—first insulation layer; 1071—first through hole; 1072—second through hole; 1073—third through hole; L1—minimum aperture of first through hole; L2—maximum aperture of second through hole; L3—maximum aperture of third through hole; L4—minimum aperture of third through hole; F1—first step; F2—second step.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the state of art, in order to obtain better signal-to-noise ratio (SNR), a sensor is usually provided with a thick insulation layer, and a conductive layer for signal transmission is usually thin in order to reduce possible leakage area, reduce leakage current and reduce noise. The slope of a side wall of the insulation layer becomes larger during roasting to cure due to material shrinkage, so the conductive layer disposed on the side wall of the insulation layer tends to be broken due to the larger slope, and hence the problem of poor conduction can occur.

Embodiments of the present disclosure provide a sensor and a manufacturing method thereof, which improve the conductivity and ensure the normal transmission of signals by arranging an auxiliary conductive layer on a thin conductive layer without addition of processes.

FIG. 1 is a sectional view of a sensor provided by an embodiment of the present disclosure. As illustrated in FIG. 1, the embodiment of the present disclosure provides a sensor 100, which comprises: a base substrate 101; a thin film transistor (TFT) 102 which is disposed on the base substrate 101 and includes a source electrode 1025, a drain electrode 1024, an active layer 1023, a gate electrode 1021 and a gate insulation layer 1022; a first insulation layer 106 disposed on the TFT 102 and provided with a first through hole 1071 running through the first insulation layer 106; a bias electrode 1032 disposed on the first insulation layer 106 and separate from the conductive layer 1031; a sensing active layer 1033 respectively connected with the conductive layer 1031 and the bias electrode 1032; and an auxiliary conductive layer 1034 disposed on the conductive layer 1031.

For instance, the sensor 100 may further comprise a passivation layer 104; the passivation layer 104 is provided with a second through hole 1072; in the direction perpendicular to the base substrate, the passivation layer 104 is disposed between the source electrode 1025 and the first insulation layer 106; and the second through hole 1072 runs through the passivation layer 104 and is communicating with the first through hole 1071.

For instance, the sensor 100 may further comprise a metal shield 105; the metal shield 105 is provided with a third through hole 1073 and disposed between the passivation layer 104 and the first insulation layer 106; the third through hole 1073 runs through the metal shield 105 and is communicating with the first through hole 1071 and the second through hole 1072; and the conductive layer 1031 is electrically connected with the source electrode 1025 via the first through hole 1071, the second through hole 1072 and the third through hole 1073.

For instance, the separation between the bias electrode 1032 and the conductive layer 1031 refers to that the bias electrode 1032 and the conductive layer 1031 do not make direct contact. For instance, in the sensor 100 provided by the embodiment of the present disclosure, an insulation spacer layer 1035 is disposed between the conductive layer 1031 and the bias electrode 1032. Moreover, for instance, the sensing active layer 1033 is disposed between the conductive layer 1031 and the bias electrode 1032. In some examples, the insulation spacer layer 1035 may also be not arranged, and the material for forming the sensing active layer 1033 is filled between the conductive layer 1031 and the bias electrode 1032.

For instance, a high voltage is applied to the bias electrode 1032, and the range of the high voltage is, for instance, 100-300 V. Moreover, for instance, the range of the high voltage is, for instance, 150-200 V. For instance, the material of the bias electrode 1032 may be a conductive metal such as molybdenum (Mo), aluminum (Al) and copper (Cu) or an alloy formed by any combination thereof; and the material of the bias electrode 1032 may also be a conductive material such as ITO, aluminum-doped zinc oxide (AZO), IZO, conductive resin, graphene film or carbon nanotube film.

For instance, the sensing active layer 1033 may also be disposed on the conductive layer 1031, and the bias electrode 1032 is disposed on the sensing active layer 1033. At this point, in order to ensure that the sensing active layer 1033 can be illuminated, the bias electrode 1032 shall be made from a transparent conductive material, e.g., ITO, IZO, AZO, conductive resin, graphene film or carbon nanotube film.

For instance, the sensing active layer 1033 is an amorphous silicon (a-Si) semiconductor layer.

For instance, the metal shield 105 may have shielding function and prevent the mutual crosstalk of electric fields on both sides of the metal shield 105. For instance, the metal shield 105 may shield an induction current produced by the electric fields in the conductive layer 1031 on the drain electrode 1024, the source electrode 1025 and a data line connected with the drain electrode 1024, so that the SNR can be improved.

For instance, the metal shield 105 may be formed by a plurality of mutually separate parts, and a stabilized voltage may be applied to part of the metal shield to improve the shielding effect.

For instance, in the sensor 100 provided by the embodiment of the present disclosure, a projection of the metal shield 105 on the base substrate 101 is at least partially overlapped with a projection of the active layer 1023 of the TFT 102 on the base substrate 101. Because light illumination can affect the switching characteristic of the TFT, the active layer 1023 of the TFT must be shielded. Because the projection of the metal shield 105 on the base substrate 101 is at least partially overlapped with the projection of the active layer 1023 of the TFT 102 on the base substrate 101, the metal shield 105 may shield the active layer 1023 of the TFT 102, so that the influence of external light on the can be avoided.

For instance, in the sensor 100 provided by an embodiment of the present disclosure, the auxiliary conductive layer 1034 and the sensing active layer 1033 are separate from each other. That is to say, the auxiliary conductive layer 1034 and the sensing active layer 1033 do not make direct contact, so the problems of leakage and noise can be avoided.

For instance, in the sensor 100 provided by an embodiment of the present disclosure, the auxiliary conductive layer 1034 is a metal oxide conductive layer.

For instance, in the sensor 100 provided by an embodiment of the present disclosure, the auxiliary conductive layer 1034 is an ITO or IZO layer. For instance, the auxiliary conductive layer 1034 and the conductive layer 1031 make direct contact.

For instance, when the conductive layer 1031 is broken, the auxiliary conductive layer 1034 may aid in the conduction of the conductive layer 1031, so as to ensure the normal transmission of signals.

For instance, in order to prevent lead electrodes in a peripheral region from being oxidized, an antioxidant conductive protective layer must be disposed on the peripheral electrodes, and the auxiliary conductive layer 1034 and the antioxidant conductive protective layer may be made from the same material (e.g., ITO) and formed in the same layer, so no additional process is required by arranging the auxiliary conductive layer 1034 on the conductive layer 1031. For instance, the data line in the sensor is connected with an integrated circuit (IC) through a lead electrode; an antioxidant protective layer must be disposed on the lead electrode to prevent the lead electrode from being oxidized; and the auxiliary conductive layer 1034 and the antioxidant conductive protective layer may be made from the same material (e.g., ITO) and formed in the same layer, so no additional process must be required.

For instance, in the sensor 100 provided by an embodiment of the present disclosure, a second insulation layer 1036 is disposed on the sensing active layer 1033. The second insulation layer 1036 may have the function of protecting the sensing active layer.

For instance, in the sensor 100 provided by an embodiment of the present disclosure, the conductive layer 1031 is a metal conductive layer.

For instance, the conductive layer 1031 may be made from any one of metals such as Mo, Al and Cu or an alloy thereof.

For instance, in the sensor 100 provided by an embodiment of the present disclosure, the thickness of the conductive layer 1031 is from 10 nm to 100 nm. Moreover, for instance, the thickness of the conductive layer 1031 is from 30 nm to 70 nm.

For instance, the first insulation layer 106, the insulation spacer layer 1035 and the second insulation layer 1036 may be organic insulation layers such as organic resin, and may also be inorganic insulation layers such as silicon nitride (SiNx) or silicon oxide (SiOx).

For instance, in the sensor 100 provided by an embodiment of the present disclosure, the thickness of the first insulation layer 106 is from 1 to 4 μm. Moreover, for instance, the thickness of the first insulation layer 106 is from 2 μm to 3 μm. Because a high voltage is applied to the bias electrode 1032, the arrangement of the thick first insulation layer 106 may reduce the interference of the electric field of the bias electrode 1032 on, for instance, the source electrode 1025 of the TFT 102. Meanwhile, the high-thickness insulation layer may also have the function of planarization, so as to be helpful to the implementation of the subsequent processes.

Figure 2:
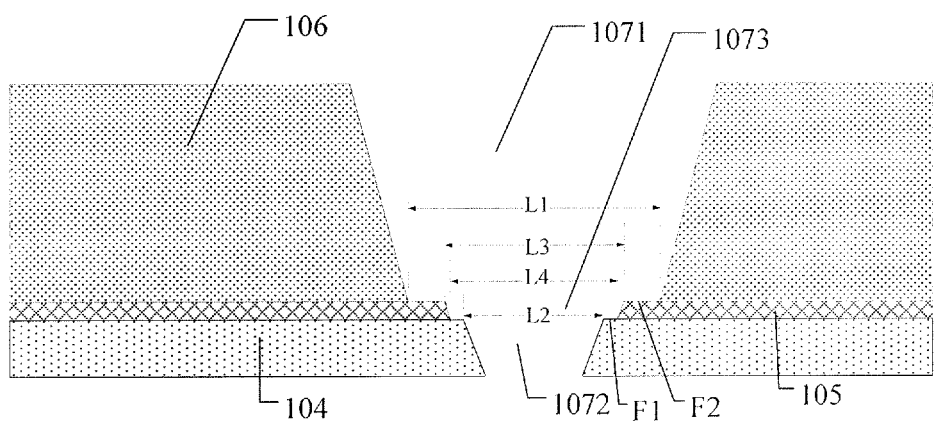
FIG. 2 is a sectional view of partial structures in the sensor provided by an embodiment of the present disclosure.

For instance, FIG. 2 is a sectional view of partial structures in the sensor provided by an embodiment of the present disclosure. As illustrated in FIG. 2, in the sensor 100 provided by the embodiment of the present disclosure, the maximum aperture L3 of the third through hole 1073 is less than the minimum aperture L1 of the first through hole 1071, and the minimum aperture L4 of the third through hole 1073 is greater than the maximum aperture L2 of the second through hole 1072. Thus, a first step F1 is formed between the passivation layer 104 and the metal shield 105, and a second step F2 is formed between the metal shield 105 and the insulation layer 106. Due to the first step F1 and the second F2, side walls of the first through hole 1071, the second through hole 1072 and the third through hole 1073 are smoother, which is helpful to the formation of the conductive layer 1031 and can prevent the breakage of the conductive layer 1031.

For instance, in the sensor 100 provided by an embodiment of the present disclosure, the conductive layer 1031 is at least disposed on the side walls of the first through hole 1071, the second through hole 1072 and the third through hole 1073; and part of the conductive layer 1031, at least disposed on the side walls, is completely covered by the auxiliary conductive layer 1034.

For instance, the passivation layer 104 may have the function of planarization, allow the metal shield 105 and the TFT to be insulated from each other, reduce the interference of the electric fields on both sides of the passivation layer 104, and improve the SNR.

For instance, the base substrate 101 is, for instance, a glass substrate or a quartz substrate.

For instance, the sensor 100 may comprise an insulation layer 106 but not comprise the metal shield 105 and the passivation layer 104. In this case, the conductive layer 1031 is disposed in the first through hole 1071 and on part of the first insulation layer 106 and is electrically connected with the source electrode 1025 via the first through hole 1071. For instance, in this case, the conductive layer 1031 is at least disposed on a side wall of the first through hole 1071; and part of the conductive layer 1031, at least disposed on the side wall, is completely covered by the auxiliary conductive layer 1034.

For instance, the sensor 100 may comprise the insulation layer 106 and the passivation layer 104 but may not comprise the metal shield 105. At this point, the conductive layer 1031 is disposed in the first through hole 1071 and the second through hole 1072 and on part of the first insulation layer 106 and electrically connected with the source electrode 1025 via the first through hole 1071 and the second through hole 1072. For instance, in this case, the maximum aperture L2 of the second through hole 1072 is less than the minimum aperture L1 of the first through hole 1071. The conductive layer 1031 is at least disposed on side walls of the first through hole 1071 and the second through hole 1072; and part of the conductive layer 1031, at least disposed on the side walls, is completely covered by the auxiliary conductive layer 1034.

The sensor provided by an embodiment of the present disclosure is, for instance, a photoelectric sensor, but not only limited to the photoelectric sensor, and may also be other kind of sensors for realizing signal transmission via current.

An embodiment of the present disclosure further provides an electronic device, which comprises any foregoing sensor provided by an embodiment of the present disclosure.

An embodiment of the present disclosure further provides a method for manufacturing a sensor, which comprises: forming a thin film transistor (TFT) on a base substrate, in which the TFT includes a source electrode; forming a first insulation layer on the TFT, in which the first insulation layer is provided with a first through hole; forming a conductive layer in the first through hole and on part of the first insulation layer, in which the conductive layer is electrically connected with the source electrode via the first through hole; forming a bias electrode separate from the conductive layer and a sensing active layer on the first insulation layer, in which the sensing active layer is respectively connected with the conductive layer and the bias electrode; and forming an auxiliary conductive layer on the conductive layer.

For instance, the method for manufacturing the sensor, provided by an embodiment of the present disclosure, further comprises: forming an insulation spacer layer between the conductive layer and the bias electrode.

For instance, the method for manufacturing the sensor, provided by an embodiment of the present disclosure, further comprises: forming a second insulation layer on the sensing active layer.

For instance, the method for manufacturing the sensor, provided by an embodiment of the present disclosure, further comprises: forming a passivation layer between the source electrode and the first insulation layer, in which the passivation layer is provided with a second through hole communicating with the first through hole; and forming a conductive layer electrically connected with the source electrode via the first through hole and the second through hole.

For instance, the method for manufacturing the sensor, provided by an embodiment of the present disclosure, further comprises: forming a metal shield between the passivation layer and the first insulation layer, in which the metal shield is provided with a third through hole communicating with the first through hole and the second through hole; and forming a conductive layer electrically connected with the source electrode via the first through hole, the second through hole and the third through hole.

Figure 3:
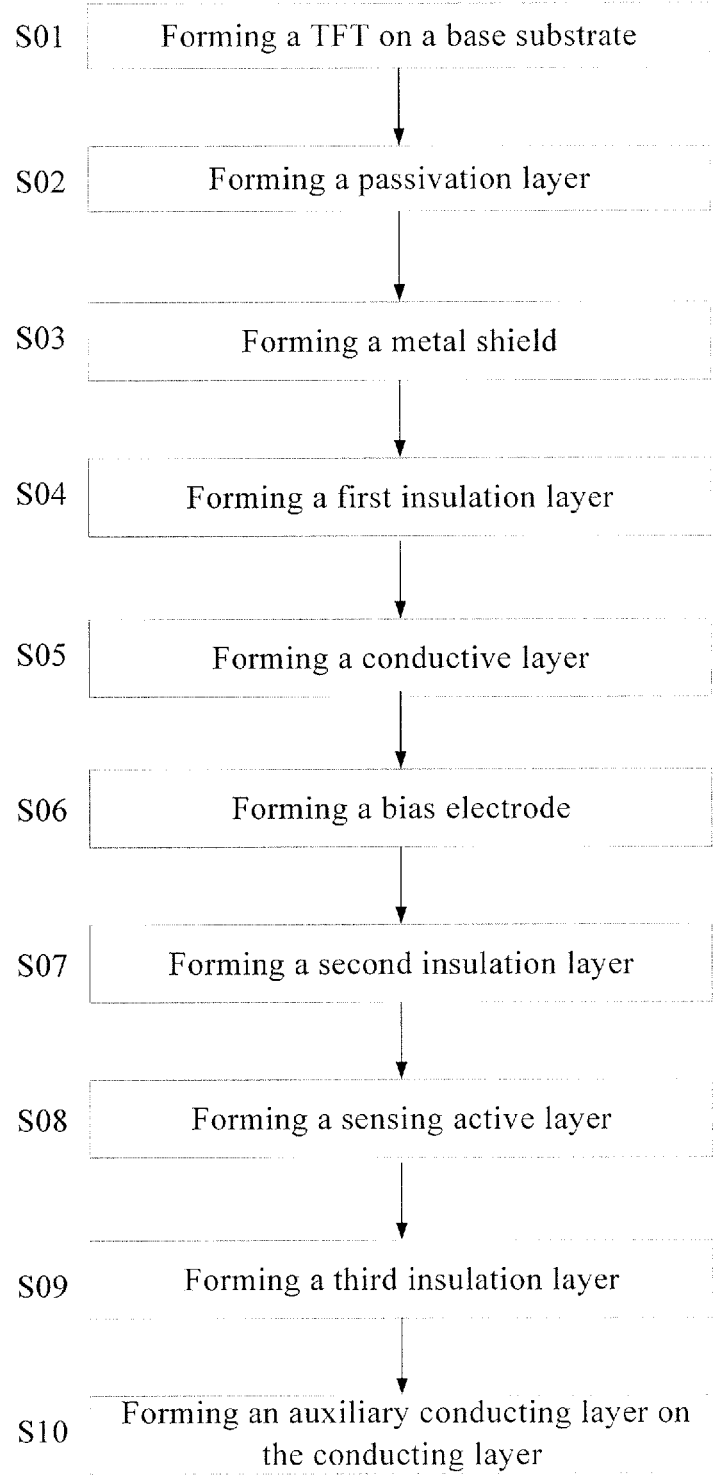
FIG. 3 is a flow diagram of a method for manufacturing a sensor, provided by an embodiment of the present disclosure.
Figure 4A:
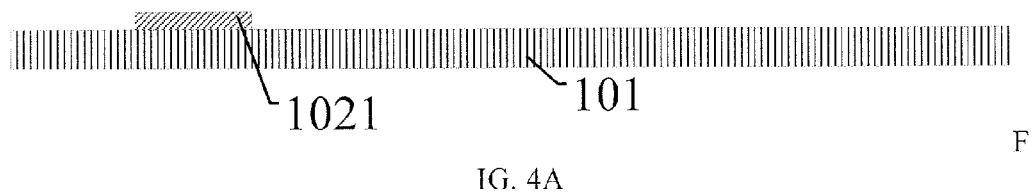
FIGS. 4A-4L are schematic diagrams of the method for manufacturing the sensor provided by an embodiment of the present disclosure.
Figure 4B:
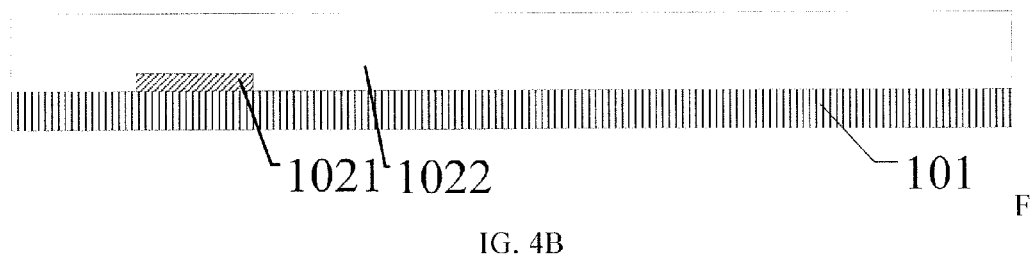
Figure 4C:
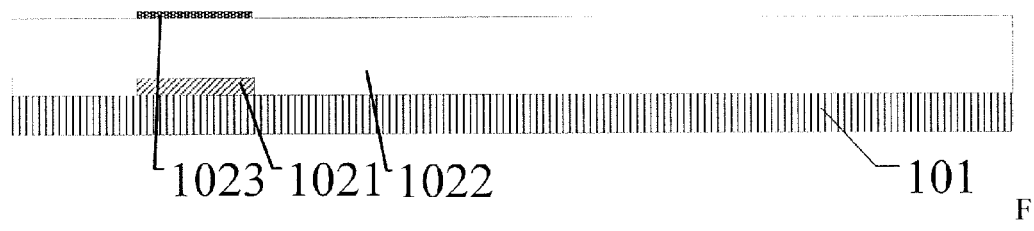
Figure 4D:
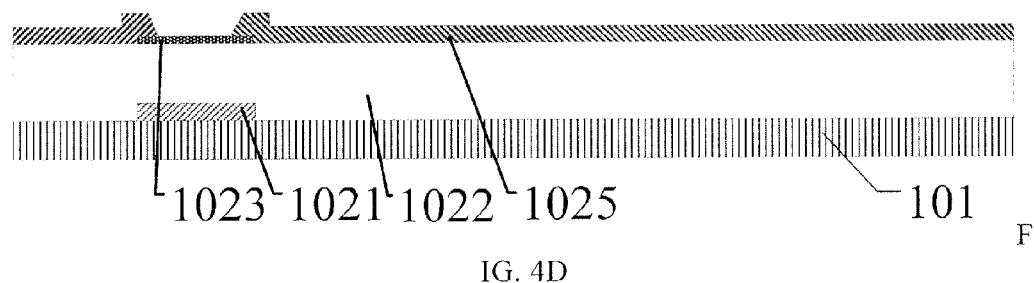

For instance, FIG. 3 is a flow diagram of the method for manufacturing the sensor, provided by an embodiment of the present disclosure, and FIGS. 4A-4L are schematic diagrams of the method for manufacturing the sensor, provided by an embodiment of the present disclosure. The manufacturing method may comprise the following operations:

Step S01: as illustrated in FIGS. 4A-4D, forming a TFT 102 on a base substrate 101. The step, for instance, includes the following operations:

Step S011: as illustrated in FIG. 4A, forming a gate electrode 1021 on the base substrate;

Step S012: as illustrated in FIG. 4B, forming a gate insulation layer 1022 on the gate electrode 1021;

Step S013: as illustrated in FIG. 4C, forming an active layer 1023 on the gate insulation layer 1022; and Step S014: as illustrated in FIG. 4D, forming a source electrode 1025 and a drain electrode 1024 on the active layer 1023.

Figure 4E:
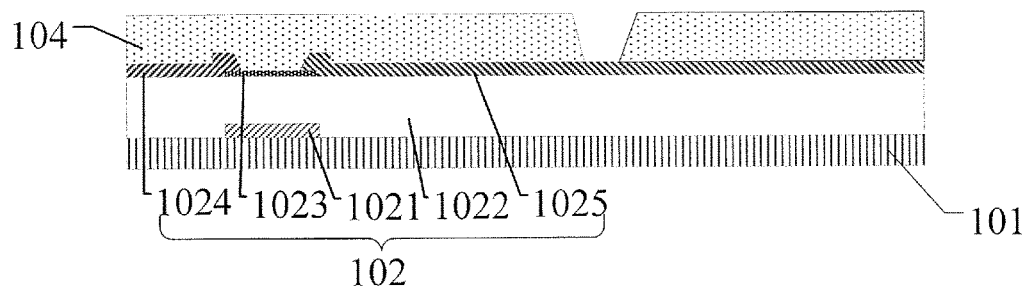

Step S02: as illustrated in FIG. 4E, forming a passivation layer 104 on the TFT 102, in which the passivation layer 104 is provided with a second through hole 1072.

Figure 4F:
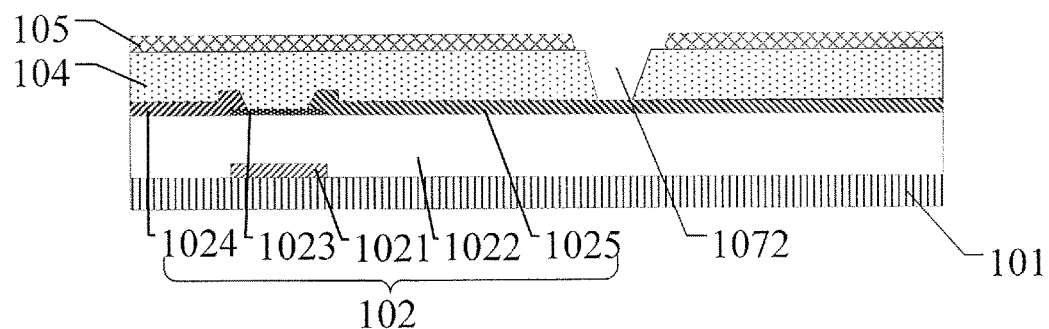

Step S03: as illustrated in FIG. 4F, forming a metal shield 105 on the passivation layer 104, in which the metal shield 105 is provided with a third through hole 1073 communicating with the second through hole 1072.

Figure 4G:
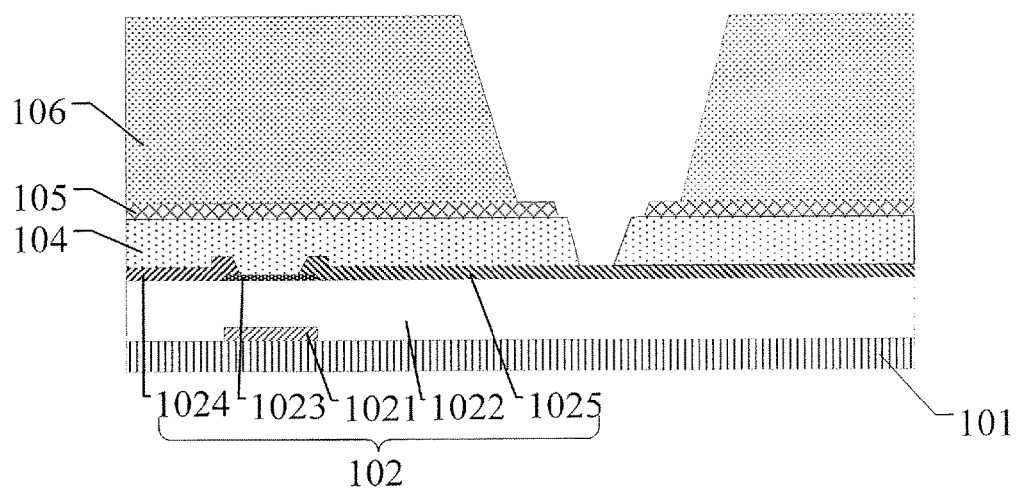

Step S04: as illustrated in FIG. 4G, forming a first insulation layer 106 on the metal shield 105, in which the first insulation layer 106 is provided with the first through hole 1071 communicating with the third through hole 1073.

Figure 4H:
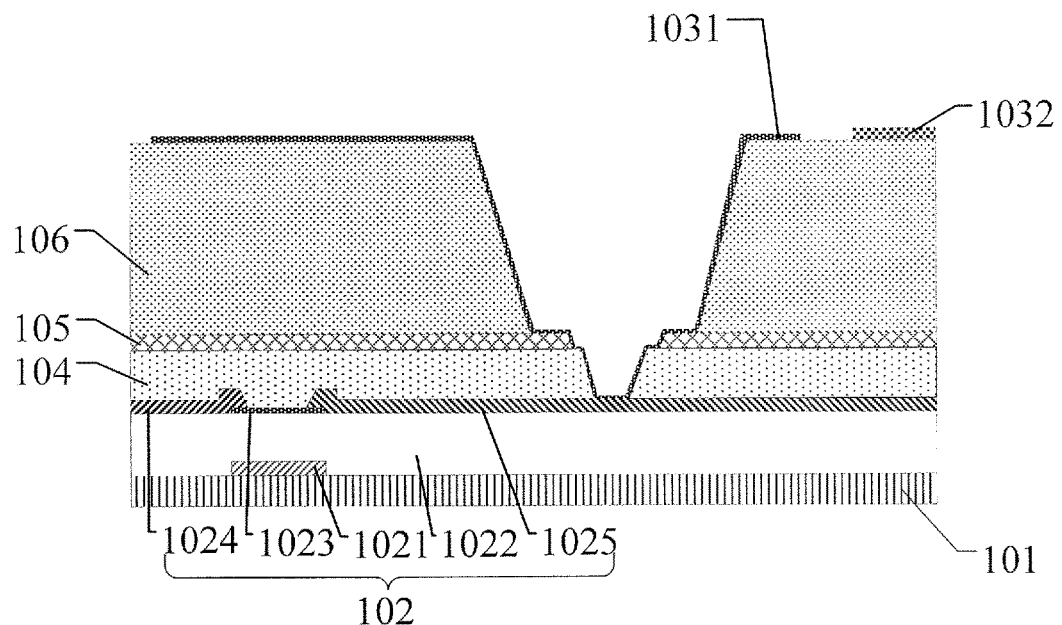
Figure 4I:
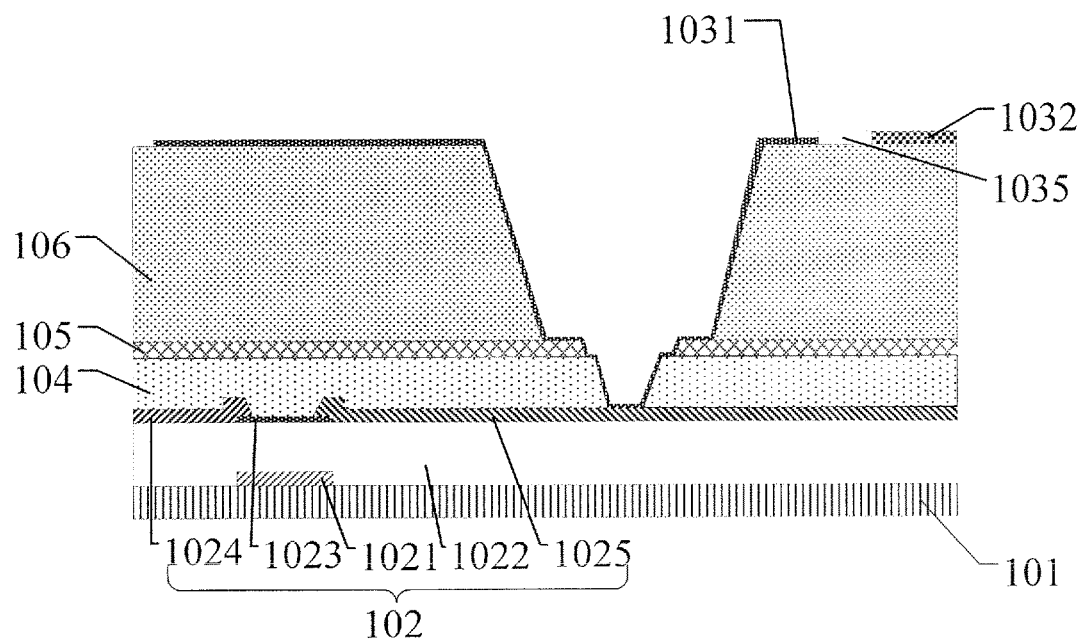

Step S05: as illustrated in FIG. 4H, forming a conductive layer 1031 in the first through hole 1071, the second through hole 1072 and the third through hole 1073 and on part of the first insulation layer 106, in which the conductive layer 1031 is electrically connected with the source electrode 1025 via the first through hole 1071, the second through hole 1072 and the third through hole 1073.

Step S06: as illustrated in FIG. 4H, forming a bias electrode 1032 separate from the conductive layer 1031 on the first insulation layer 106.

Step S07: as illustrated in FIG. 4, forming an insulation spacer layer 1035 between the conductive layer 1031 and the bias electrode 1032.

Figure 4J:
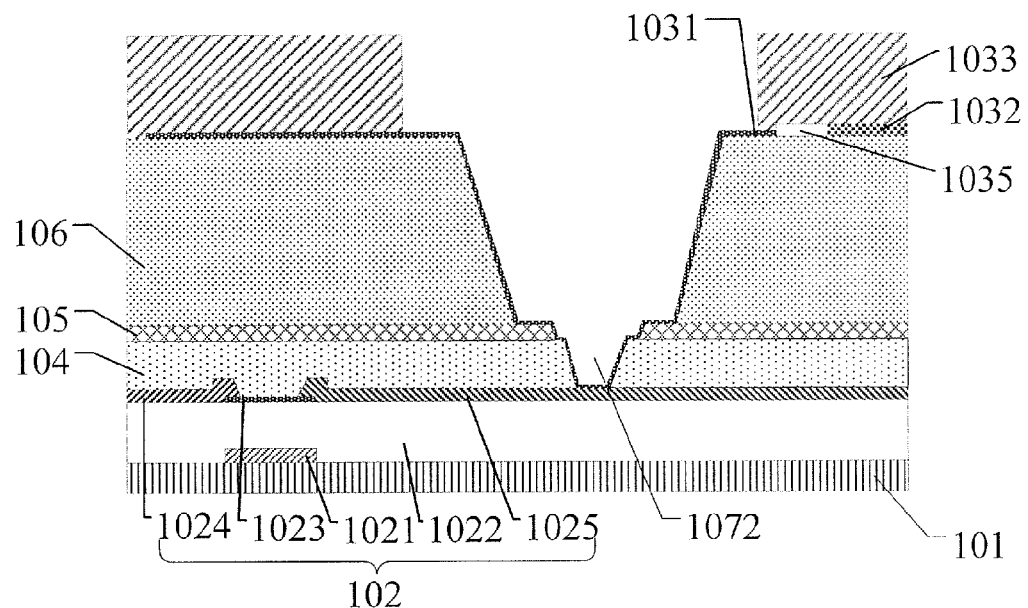

Step S08: as illustrated in FIG. 4J, forming a sensing active layer 1033, in which the sensing active layer 1033 is respectively connected with the conductive layer 1031 and the bias electrode 1032.

Figure 4K:
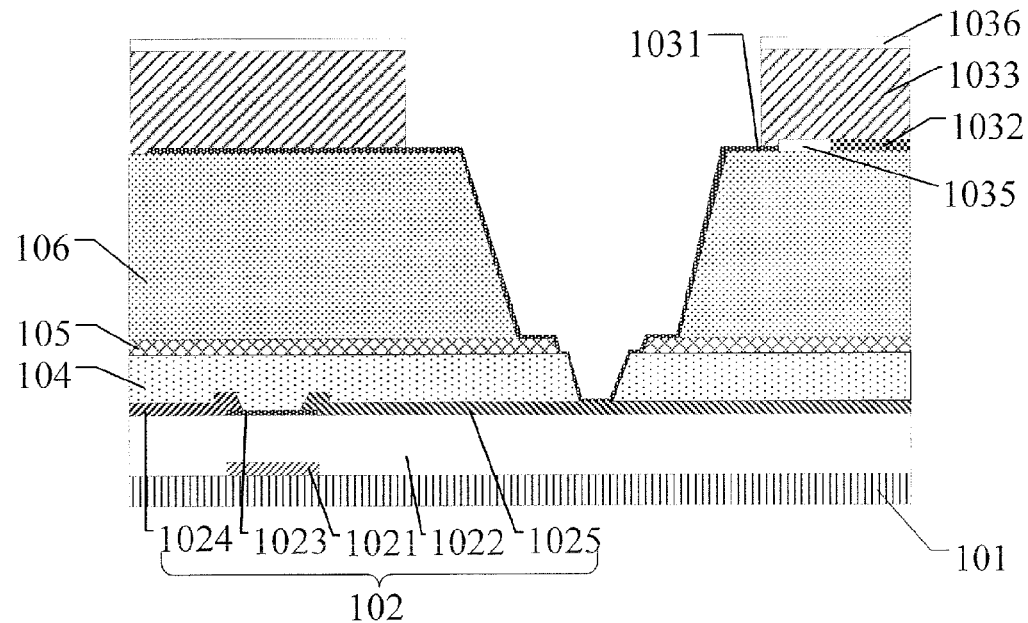

Step S09: as illustrated in FIG. 4K, forming a second insulation layer 1036 on the sensing active layer 1033.

Figure 4L:
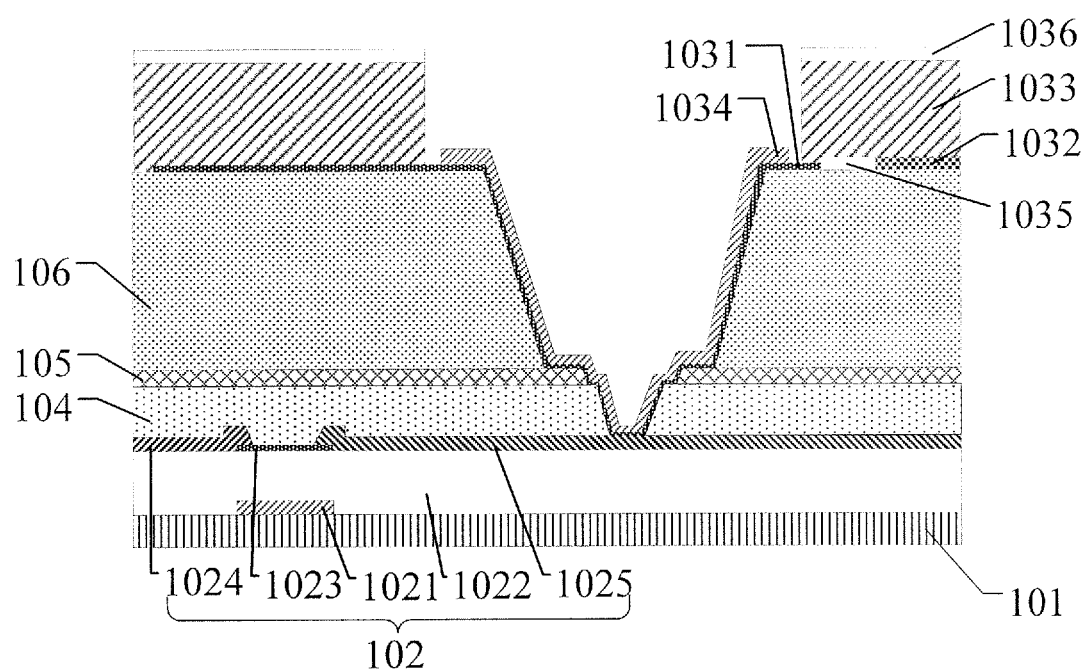

Step S10: as illustrated in FIG. 4L, forming an auxiliary conductive layer 1034 on the conductive layer 1031.

For instance, in order to prevent a lead electrode in a peripheral region from being oxidized, an antioxidant conductive protective layer must be disposed on the electrode in the peripheral region, and the auxiliary conductive layer 1034 and the antioxidant conductive protective layer may be made from the same material (e.g., ITO) and formed in the same layer, so no additional process is added by arranging the auxiliary conductive layer 1034 on the conductive layer 1031. For instance, a data line in the sensor is connected with an IC through the lead electrode; an antioxidant protective layer must be disposed on the lead electrode to prevent the lead electrode from being oxidized; and the auxiliary conductive layer 1034 and the antioxidant conductive protective layer may be made from the same material (e.g., ITO) and formed in the same layer, so no additional process must be required.

For instance, each step includes the processes such as deposition (or sputtering), cleaning, photoresist coating, exposure, development, etching, and photoresist removal (e.g., stripping).

For instance, the gate electrodes 1021 may be made from any metal selected from Cr, W, Ti, Ta, Mo, Al and Cu or an alloy thereof.

For instance, the gate insulation layer 1022 may be made from SiNx or SiOx.

For instance, the active layer 1023 and the sensing active layer 1033 may be made from a-Si.

For instance, the source electrode 1025 and the drain electrode may be made from any one of AlNd alloy, WMo alloy, Al, Cu, Mo and Cr or a combination thereof.

For instance, the passivation layer 104 may be made from SiNx or SiOx.

For instance, the metal shield 105 may be made from any metal selected from Mo, Al and Cu or an alloy thereof.

For instance, the first insulation layer 106, the insulation spacer layer 1035 and the second insulation layer 1036 may be made from organic resin, SiNx or SiOx.

For instance, the conductive layer 1031 may be made from any one of metals such as Mo, Al and Cu or an alloy thereof.

For instance, the auxiliary conductive layer 1034 may be made from ITO or IZO.

For instance, the material of the bias electrode 1032 may be a conductive metal such as Mo, Al and Cu or an alloy formed by any combination thereof; and the material of the bias electrode 1032 may also be the conductive material such as ITO, AZO, IZO, conductive resin, graphene film and carbon nanotube film.

The sensor and the manufacturing method thereof, provided by an embodiment of the present disclosure, improve the conductivity and ensure the normal transmission of signals by arranging an auxiliary conductive layer on a thin conductive layer without addition of processes.

It should be noted that not all the structures of the sensor and the electronic device are given in the embodiments and the accompanying drawings of the present disclosure for clear description. In order to realize necessary functions of the sensor and the electronic device, other structures not shown may be arranged by those skilled in the art according to specific application scenes with reference to the prior art. No limitation will be given here in the present disclosure.

What are described above is related to the illustrative embodiments of the disclosure only and not limitative to the scope of the disclosure; the scopes of the disclosure are defined by the accompanying claims.

What is claimed is:

1. A sensor, comprising:
    a base substrate;
    a thin-film transistor (TFT) disposed on the base substrate and including a source electrode;
    a first insulation layer disposed on the TFT and provided with a first through hole running through the first insulation layer;
    a conductive layer disposed in the first through hole and on part of the first insulation layer and electrically connected with the source electrode via the first through hole;
    a bias electrode disposed on the first insulation layer and separate from the conductive layer;
    a sensing active layer respectively connected with the conductive layer and the bias electrode;
    an auxiliary conductive layer disposed on the conductive layer;
    a passivation layer provided with a second through hole; and
    a metal shield provided with a third through hole,
    wherein in an direction perpendicular to the base substrate, the passivation layer is disposed between the source electrode and the first insulation layer; the second through hole is configured to run through the passivation layer and communicate with the first through hole; and the conductive layer is electrically connected with the source electrode via the first through hole and the second through hole;
    wherein the metal shield is disposed between the passivation layer and the first insulation layer; the third through hole is configured to run through the metal shield and communicate with the first through hole and the second through hole; and the conductive layer is electrically connected with the source electrode via the first through hole, the second through hole and the third through hole.

2. The sensor according to claim 1, wherein the auxiliary conductive layer is separate from the sensing active layer.

3. The sensor according to claim 1, wherein the auxiliary conductive layer is a metal oxide conductive layer.

4. The sensor according to claim 1, wherein the auxiliary conductive layer is an indium tin oxide (ITO) layer or an indium zinc oxide (IZO) layer.

5. The sensor according to claim 1, wherein the auxiliary conductive layer is in direct contact with the conductive layer.

6. The sensor according to claim 1, wherein a second insulation layer is disposed on the sensing active layer.

7. The sensor according to claim 1, wherein the conductive layer is a metal conductive layer.

8. The sensor according to claim 1, wherein a thickness of the conductive layer is from 10 nm to 100 nm.

9. The sensor according to claim 1, wherein a maximum aperture of the second through hole is less than a minimum aperture of the first through hole.

10. The sensor according to claim 1, wherein a projection of the metal shield on the base substrate is at least partially overlapped with a projection of an active layer of the TFT on the base substrate.

11. The sensor according to claim 1, wherein a maximum aperture of the third through hole is less than a minimum aperture of the first through hole, and a minimum aperture of the third through hole is greater than a maximum aperture of the second through hole.

12. The sensor according to claim 1, wherein the conductive layer is at least disposed on side walls of the first through hole, the second through hole and the third through hole; and part of the conductive layer, at least disposed on the side walls, is completely covered by the auxiliary conductive layer.

13. The sensor according to claim 1, wherein a thickness of the first insulation layer is from 1 μm to 4 μm.

14. An electronic device, comprising the sensor according to claim 1.

15. A method for manufacturing a sensor, comprising:
forming a thin film transistor (TFT) on a base substrate, in which the TFT includes a source electrode;
forming a first insulation layer on the TFT, in which the first insulation layer is provided with a first through hole;
forming a conductive layer in the first through hole and on part of the first insulation layer, in which the conductive layer is electrically connected with the source electrode via the first through hole;
forming a bias electrode separate from the conductive layer and a sensing active layer on the first insulation layer, in which the sensing active layer is respectively connected with the conductive layer and the bias electrode;
forming an auxiliary conductive layer on the conductive layer,
forming a passivation layer between the source electrode and the first insulation layer, in which the passivation layer is provided with a second through hole communicating with the first through hold;
forming a conductive layer electrically connected with the source electrode via the first through hold and the second through hole;
forming a metal shield between the passivation layer and the first insulation layer, in which the metal shield is provided with a third through hold communicating with the first through hold and the second through hole; and
forming a conductive layer electrically connected with the source electrode via the first through hole, the second through hole, and the third through hole.

16. The method for manufacturing the sensor according to claim 15, further comprising: forming a second insulation layer on the sensing active layer.

* * * * *